US009508574B2

(12) United States Patent
Marumoto et al.

(10) Patent No.: US 9,508,574 B2
(45) Date of Patent: Nov. 29, 2016

(54) PROCESS LIQUID SUPPLY APPARATUS OPERATING METHOD, PROCESS LIQUID SUPPLY APPARATUS AND NON-TRANSITORY STORAGE MEDIUM

(71) Applicant: TOKYO ELECTRON LIMITED, Tokyo (JP)

(72) Inventors: Hiroshi Marumoto, Koshi (JP); Koji Takayanagi, Koshi (JP); Kenji Adachi, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 532 days.

(21) Appl. No.: 13/956,507

(22) Filed: Aug. 1, 2013

(65) Prior Publication Data

US 2014/0034584 A1    Feb. 6, 2014

(30) Foreign Application Priority Data

Aug. 3, 2012 (JP) .................. 2012-173299

(51) Int. Cl.
*B01D 19/00* (2006.01)
*H01L 21/67* (2006.01)
*B01D 36/00* (2006.01)

(52) U.S. Cl.
CPC ....... *H01L 21/6715* (2013.01); *B01D 19/0031* (2013.01); *B01D 19/0036* (2013.01); *B01D 36/001* (2013.01); *H01L 21/67017* (2013.01)

(58) Field of Classification Search
None
See application file for complete search history.

(56) References Cited

U.S. PATENT DOCUMENTS

| | | | | |
|---|---|---|---|---|
| 6,238,576 B1 * | 5/2001 | Yajima | ............... | B01D 35/26 210/194 |
| 6,418,942 B1 * | 7/2002 | Gray | .................. | B08B 3/10 134/1.3 |
| 2007/0119307 A1 * | 5/2007 | Park | ............... | B01D 19/0036 96/243 |

FOREIGN PATENT DOCUMENTS

| | | |
|---|---|---|
| JP | 4-196517 A | 7/1992 |
| JP | 2011-230367 A | 11/2011 |

OTHER PUBLICATIONS

A technique for rapid elimination of microbubbles for photochemical filter startup, Aiwen Wu, accessed Apr. 8, 2016.*

* cited by examiner

*Primary Examiner* — Duane Smith
*Assistant Examiner* — Phillip Shao
(74) *Attorney, Agent, or Firm* — Nath, Goldberg & Meyer; Jerald L. Meyer

(57) ABSTRACT

According to an embodiment of the present disclosure, a process liquid supply apparatus operating method is provided. The method includes filling a filter unit with a process liquid from an upstream side of the filter unit to a downstream side of the filter unit after newly mounting or replacing the filter unit and repeating a depressurization filtering process and a pressurization filtering process for a predetermined number of times. The depressurization filtering process depressurizes the process liquid in the downstream side of the filter unit and thereby allows the process liquid to permeate through the filter unit. The pressurization filtering process pressurizes the process liquid from the upstream side of the filter unit and thereby allows the process liquid to permeate through the filter unit.

5 Claims, 13 Drawing Sheets

Ps(Positive pressure)
Ps ≫ Pi

PROCESS LIQUID SUPPLY APPARATUS OPERATING METHOD, PROCESS LIQUID SUPPLY APPARATUS AND NON-TRANSITORY STORAGE MEDIUM

CROSS-REFERENCE TO RELATED APPLICATION

This application claims the benefit of and priority from Japanese Patent Application No. 2012-173299, filed on Aug. 3, 2012, in the Japan Patent Office, the disclosure of which is incorporated herein in its entirety by reference.

TECHNICAL FIELD

The present disclosure relates to an operation performed prior to the beginning of a process using a process liquid in a process liquid supply apparatus that ejects a process liquid from a nozzle via a filter unit.

BACKGROUND

A liquid process is performed in a manufacture process of a semiconductor device by supplying liquid chemicals (e.g., a resist liquid, an acid or alkali cleaning liquid, a solvent, a precursor-containing liquid for forming an insulation film, etc.) from a nozzle to a substrate. Such a liquid chemical supply apparatus is configured to remove foreign substances by a filter unit disposed in a supply passage.

Bubbles may be created in the aforementioned process due to gas dissolved in a resist or a liquid chemical. A line width of a pattern becomes finer and finer. Thus, cautious measures should be taken for fine bubbles that are not problematic in the past.

A coating apparatus for coating the aforesaid liquid chemical performs a gas removal process of removing the gas in a filter unit in order to remove foreign substances contained in a process liquid. The gas removal process makes the process liquid permeate through the filter unit (hereinafter, referred to as "a filter wetting process") when the filter unit is newly mounted or replaced. For example, as a method of performing the filter wetting process, filtering is performed under a positive pressure (pressure higher than an atmospheric pressure) using a pressure of a $N_2$ gas or a pressure produced by a pump after setting the filter unit, and thereafter the number of defects on a substrate caused by the bubbles is monitored. Further, in the method of performing the filter wetting process, the gas in the filter unit is regarded as fully removed when the number of defects decreases to a predetermined level, and the filter wetting process is finished accordingly.

However, in this method, to reduce the cost for mass production, the process liquid amount consumed before the filter unit starts to operate should be reduced. Additionally, the operative time should be shortened.

By way of another example, the filter unit communicating with a process liquid ejecting nozzle may have a structural feature for reducing the number of bubbles in the process liquid passing through the filter unit. In this example, the filter unit may have repetitive prominences and depressions on a wall surface, but this may lead to complexity in manufacturing the filter unit.

SUMMARY

Various embodiments of the present disclosure provide a technique for accomplishing the reduction in the liquid chemical spent for removing bubbles from a filter unit as well as the shortening in an operative time when the filter unit is newly mounted in a liquid chemical supply passage or the filter unit provided in the liquid chemical supply passage is replaced.

According to a first aspect of the present disclosure, there is provided a method of operating a process liquid supply apparatus. The process liquid supply apparatus includes a filter unit, a discharge outlet for a gas in a process liquid, and a liquid sending unit, which are provided in a flow passage located between a process liquid supply source and a nozzle in that order from an upstream side. The process liquid supply apparatus supplies the process liquid to target objects through the nozzle by the liquid sending unit. The method includes filling the filter unit with the process liquid from an upstream side of the filter unit to a downstream side of the filter unit after newly mounting or replacing the filter unit, and repeating a depressurization filtering process and a pressurization filtering process for a predetermined number of times. The depressurization filtering process depressurizes the process liquid in the downstream side of the filter unit and thereby allows the process liquid to permeate through the filter unit. The pressurization filtering process pressurizes the process liquid from the upstream side of the filter unit and thereby allowing the process liquid to permeate through the filter unit.

According to a second aspect of the present disclosure, there is provided a process liquid supply apparatus which includes a filter unit, a discharge outlet for a gas in a process liquid, and a liquid sending unit, which are provided in a flow passage located between a process liquid supply source and a nozzle in that order from an upstream side, and supplies the process liquid to target objects through the nozzle by the liquid sending unit. The process liquid supply apparatus includes a control unit configured to output a control signal for performing filling the filter unit with the process liquid from an upstream side of the filter unit to a downstream side of the filter unit after newly mounting or replacing the filter unit; and repeating a depressurization filtering process and a pressurization filtering process for a predetermined number of times. The depressurization filtering process depressurizes the process liquid in the downstream side of the filter unit and thereby allows the process liquid to permeate through the filter unit. The pressurization filtering process pressurizes the process liquid from the upstream side of the filter unit and thereby allowing the process liquid to permeate through the filter unit.

According to a third aspect of the present disclosure, there is provided a non-transitory storage medium storing a computer program for use in an apparatus, which performs the method of operating the process liquid supply apparatus using the process liquid supplied from the process liquid supply source. The computer program is configured to execute the method of operating the process liquid supply apparatus according to the first aspect of the present disclosure.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
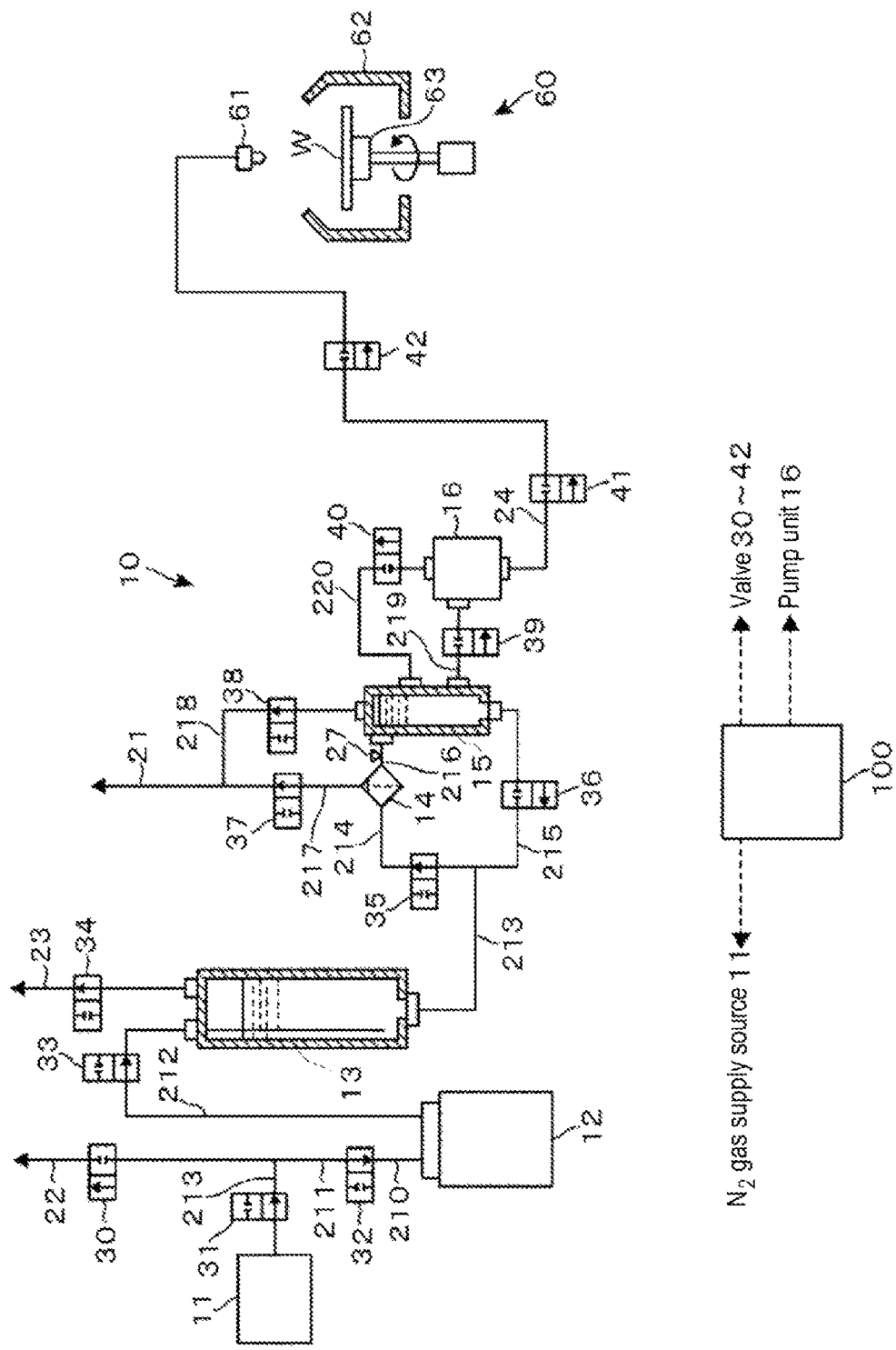
FIG. 1 is configuration diagram showing one embodiment of a resist supply apparatus constituting a resist coating apparatus according to one embodiment of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Descriptions will be made below as to embodiments of a resist coating apparatus as a liquid processing apparatus according to the present disclosure.

First, the whole configuration of the resist coating apparatus will be briefly described with reference to FIG. 1. The resist coating apparatus comprises the following: a cup module 60 having a spin chuck 63 (substrate holding part) configured to horizontally hold a wafer W (i.e. a substrate); a nozzle 61 configured to supply a resist (process liquid) to a central portion of the wafer W held by the spin chuck 63; and a resist supply apparatus 10 (process liquid supply apparatus) configured to supply the resist to the nozzle 61.

The cup module 60 includes a cup body 62 that surrounds the spin chuck 63 and receives the resist dropping from the wafer W. A suction/exhaust passage is connected to a lower portion of the spin chuck 63. Further, the lower portion of the spin chuck 63 is provided with a drain mechanism that is configured to discharge a drain liquid. Alternatively, to prevent mist from rising, the cup body 62 may comprises a combination of an inner cup and an outer cup.

The resist supply apparatus 10 may be constructed by combining a plurality of mechanisms and a piping system having a plurality of pipes. At the upstream side in a resist flow, the resist supply apparatus 10 includes a closed bottle 12 configured to store the resist. Two pipes 210 and 212 are connected to a top of the bottle 12. One pipe 212 is connected to a top port of a liquid end tank 13 via a valve 33 and then extends from the top port toward a bottom of the liquid end tank 13. The other pipe 210 is connected to one end of a valve 32. A pipe 211 is connected to the other end of the valve 32. The pipe 211 is branched into two pipes 213 and 22. One pipe 213 is connected to a pressurizing gas supply source (in this embodiment, a $N_2$ gas supply source 11) via the valve 31. The other pipe 22 is open toward the outside via a valve 30, thus serving as an exhaust pipe.

The liquid end tank 13 is provided to stably supply the resist to the wafer W. To manage a liquid amount, a plurality of liquid level sensors (not shown) are mounted in the liquid end tank 13. In addition to the pipe 212 extending from the bottle 12 toward the inside of the liquid end tank 13, a drain pipe 23 extending from the inside of the liquid end tank 13 is connected to the top of the liquid end tank 13. A valve 34 is provided in the drain pipe 23. A pipe 213 that supplies the resist is connected to a bottom port of the liquid end tank 13. The pipe 213 is branched into two pipes 214 and 215. One pipe 214 is connected to the upstream side of a filter unit 14 via a valve 35, while the other pipe 215 is connected to a bottom port of a trap 15 via a valve 36.

Figure 2A:
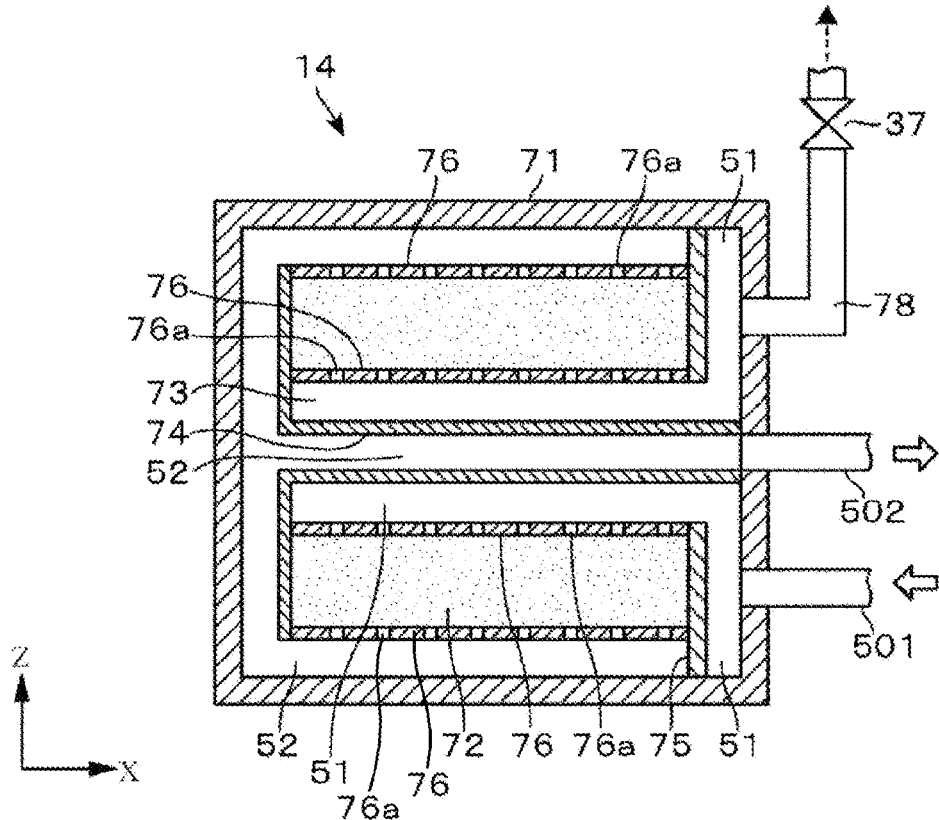
FIG. 2A is a longitudinal sectional view showing one example of a filter unit.
Figure 2B:
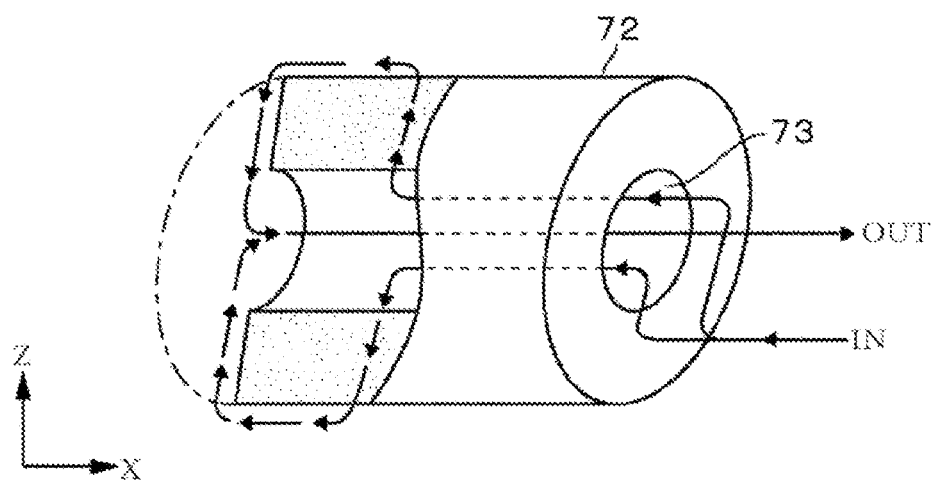
FIG. 2B is a perspective view showing one example of a filtering portion.

As shown in FIG. 2A, the filter unit 14 includes a filtering portion 72 configured to filter a process liquid (in this embodiment, the resist) and a support member. The support member includes, for example, a container body 71, a partition member 74 and a plate 75. The filtering portion 72 may include, for example, a hollow fiber membrane. In FIG. 2A, the resist flows through a supply port 501 into the inside of the filter unit 14. The resist goes throw a first flowing chamber 51 and is then filtered at the filtering portion 72. Thereafter, the resist goes through a second flowing chamber 52 and then flows out from an outlet port 502. The filtering portion 72 and the first flowing chamber 51 are isolated by the plate 76 having flowing holes 76a. Further, the filtering portion 72 and the second flowing chamber 52 are isolated by the plate 76 having flowing holes 76a. As shown in FIG. 2B, the filtering portion 72 may have, for example, a hollow cylindrical shape. A drain passage 78 used as a vent is provided at the upstream side of the filter unit 14.

Descriptions will be made continuously with reference to FIG. 1. A pipe 216 is connected to the downstream side of the filter unit 14 at its one end and is connected to a top wall of the trap 15 at its opposite end. A liquid particle counter 27 is mounted to the pipe 216. The trap 15 stores the process liquid that is ejected from the filter unit 14 and contains bubbles and foreign substances. Further, the trap 16 discharges said process liquid to a drain pipe 21 used as a discharge outlet, which will be described below. Thus, the trap 15 prevents the bubbles or the foreign substances from being ejected to the wafer W.

Pipes 217 and 218 are connected to the upstream side of the filter unit 14 and a top port of the trap 15, respectively. Further, the pipes 217 and 218 are connected to the drain pipe 21 via respective valves 37 and 38. Pipes 219 and 220 are connected to a port located at a lower side of the trap 15 and a port located at an upper side of the trap 15, respectively. The pipe 219 extending from the lower side is connected to the upstream side of a pump unit 16 via a valve 39. The pipe 220 extending from the upper side is connected to the upstream side of the pump unit 16 via a valve 40.

By way of example, a pump mechanism that is configured to perform suction and pressurization done outside of a pump is used as the pump unit 16. The pump unit 16 includes a diaphragm pump. A pipe 24 extending to the nozzle 61 is connected to the downstream side of the pump unit 16. A valve 41 and an electro pneumatic air-operated valve 42 are interposed between the pump unit 16 and the nozzle 61. The ejection of the resist toward the nozzle 61 may be controlled by opening and closing the electro pneumatic air-operated valve 42.

Figure 3:
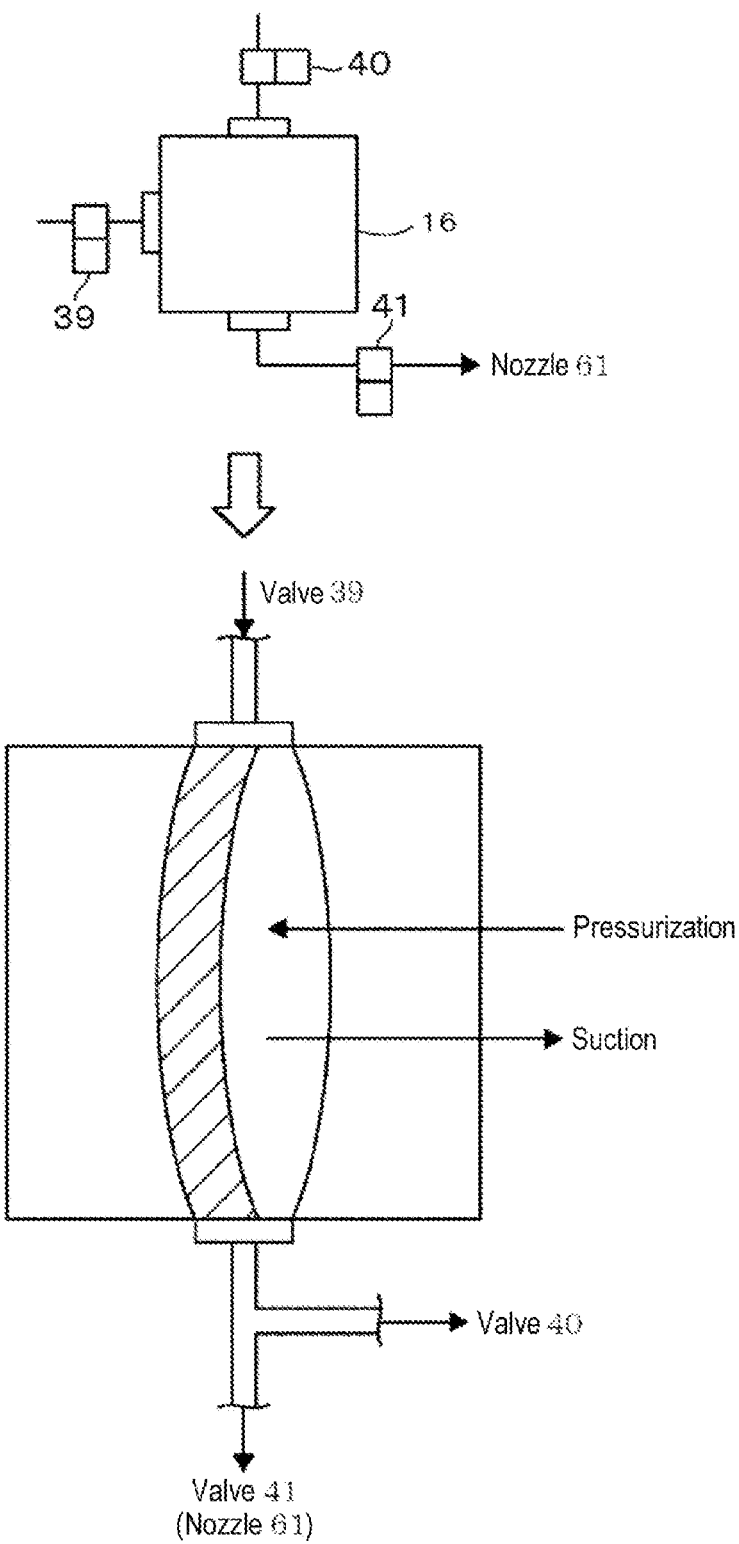
FIG. 3 illustrates an example of a structure of a pump unit.

FIG. 1 and the upper portion of FIG. 3 show that the pump unit 16 has one flow-in port and two flow-out ports. However, the depiction on the ports of the pump unit is only illustrative. In one embodiment, as shown a lower portion of FIG. 3, the pump unit 16 has one flow-out port. The pump unit 16 operates by the pressurization and suction done to the pump unit 16 as well as the cooperation with the valves 39 and 40.

The above-described resist coating apparatus is controlled by a control unit 100. The control unit 100 comprises a central processing unit (CPU), a main memory and a bus. The control of the components of the resist coating apparatus is performed by a program including commands (steps) that controls each of the components and allows it to perform its predetermined process. Said program is stored in a computer storage medium such as a flexible disc, a compact disc, a hard disc, a magneto-optical (MO) disc or the like and is installed in the main memory. The program to be installed in the main memory also includes programs for controlling the spin chuck 63, the nozzle 61, the $N_2$ gas supply source, the bottle 12, the filter unit 14, etc. The program is read by the CPU for controlling the components.

Next, an example of a procedure of a filter wetting process in the resist supply apparatus 10 will be described.

First, prior to mounting a filter, the resist is discharged from the resist supply apparatus 10. Once the resist is discharged, the valve 32 is closed and then the valves 30 and 31 are opened. Then, the $N_2$ gas is evacuated from the exhaust pipe 22 and the $N_2$ gas pressure from the $N_2$ gas supply source 11 is adjusted, for example, to 5 kPa. The reason for setting the $N_2$ gas pressure to 5 kPa is to prevent the foaming in the filter unit 14 and increase a permeation effect of the resist into fine grooves when the resist is injected to the system after the filter unit 14 is replaced with a new one (this will be described below). Further, the adjustment of the $N_2$ gas pressure is as follows. First, the supply of the $N_2$ gas is ceased by closing the valve 31, and then, the valves 33, 35, 38, 39 and 41 and the electro pneumatic air-operated valve 42 are opened. The evacuation from the trap 15 through the drain pipe 21 and the evacuation from the nozzle 61 are performed, and the $N_2$ gas pressure is set to zero. Thereafter, the above-described adjustment of the $N_2$ gas pressure from $N_2$ gas supply source 11 is performed. Then, the $N_2$ gas is supplied, thereby performing pressurization to the system.

After the $N_2$ gas pressure is adjusted as described above, the filter unit 14 is newly mounted or replaced with a new one. Thereafter, the valves 32 and 33 are opened while the valves 30 and 34 are closed and the valve 31 is opened, thereby sending the resist from the bottle 12 to the liquid end tank 13 by the $N_2$ gas pressure from the $N_2$ gas supply source 11. The injection of the resist to the liquid end tank 13 is performed until the resist is stored in the liquid end tank 13 at a predetermined amount.

Next, the resist is injected from the liquid end tank 13 to the filter unit 14. The injection of the resist of this case is performed by opening the valves 35 and 37 and closing the valves 36, 38, 39, 40 and 41. The injection of the resist of this case is performed together with monitoring bubbles by the liquid particle counter 27 and monitoring the resist discharged from the interior of the filter unit 14 to the drain pipe 21 through visual observation. The resist is injected to the filter unit 14 until bubbles having a visually observable size cannot be observed.

Next, the resist is injected from the filter unit 14 into the trap 15. The injection of the resist of this case is performed by closing the valve 37 and instead opening the valve 38 in the state where the valve 35 is opened. The injection of the resist of this case is performed together with monitoring bubbles by means of the liquid particle counter 27 and monitoring the resist discharged from the interior of the trap 15 to the drain pipe 21 through visual observation. The resist is injected to the trap 15 until bubbles and foreign substances having a visually observable size cannot be observed. Then, the interior of the system is adjusted to a normal pressure and all the valves are closed. Thereafter, the entire system is maintained, for example, for about 15 minutes and the filter unit 14 is immersed in the process liquid.

Thereafter, the $N_2$ gas pressure from the $N_2$ gas supply source 11 is adjusted, for example, to 50 kPa and the valves 31, 32, 33, 35 and 37 are opened, thereby pushing the resist to the filter unit 14 by pressure. Through this step, the resist is sent by pressure from the bottle 12 to the filter unit 14 via the liquid end tank 13. Further, through this step, the bubbles, which are removed from the interior of the filter unit 14 to the resist in the above-described process, are discharged from the drain pipe 21 together with the resist. Sending the resist by pressure is performed together with monitoring bubbles by the liquid particle counter 27 and monitoring the resist discharged from the interior of the filter unit 14 to the drain pipe 21 through visual observation, and is continued until bubbles having a visually observable size cannot be observed.

Next, the resist is sent to the trap 15 by pressure. The resist is sent by pressure from the bottle 12 to the trap 15 via the liquid end tank 13 and the filter unit 14 by maintaining the $N_2$ gas pressure, for example, to 50 kPa. In this case, the valves 35 and 38 are opened and the valve 37 is closed. Through this step, the bubbles and foreign substances in the filter unit 14 and the trap 15 are discharged from the drain pipe 21. Sending the resist by pressure is performed together with monitoring bubbles by means of the liquid particle counter 27 and monitoring the resist discharged from the interior of the trap 15 to the drain pipe 21 through visual observation, and is continued until bubbles and foreign substances having a visually observable size cannot be observed.

Regarding sending the resist by pressure in this case, the pressure, which is applied to the filter unit 14 from the upstream side at an initial phase of sending by pressure the resist, is set to a pressure higher than an atmospheric pressure (hereinafter, referred to as "a positive pressure") and is not set to a pressure lower than an atmospheric pressure (hereinafter, referred to as "a negative pressure"). This process is to remove visually observable bubbles and foreign substances from the filter unit 14 and the trap 15. A negative pressure filtering process (this will be described below) is to expand bubble nucleuses remaining in the interior of the filter unit 14. In the negative pressure filtering process, a certain amount of bubbles are removed from the filter unit 14 through the pump suction, but most of the bubbles still remain in the filter unit 14. On the contrary, the positive pressure filtering can discharge the bubbles and foreign substances having a visually observable size from the interior of the filter unit 14 due to its pressure. Thus, the positive pressure filtering is performed at this step.

Through the above-described procedures, the visually-observable bubbles and foreign substances remaining in the interior of the filter unit 14 and the trap 15 are removed. Thereafter, a process for removing fine bubbles in the filter unit 14 is performed. This process includes a plurality of steps that are repeated several times. Descriptions will be made as to this process, wherein a sign is added to each step of the process for ease of explanation.

<STEP A>

First, a pressurization filtering (in this embodiment, the positive pressure filtering) is performed on the filter unit 14. That is, the upstream side of the filter unit 14 is pressurized to be at a pressure higher than the downstream side of the filter unit 14. Further, a pressure difference in this case is set to be greater than a pressure difference in a normal operation for supplying the resist to the wafer W.

Figure 4:
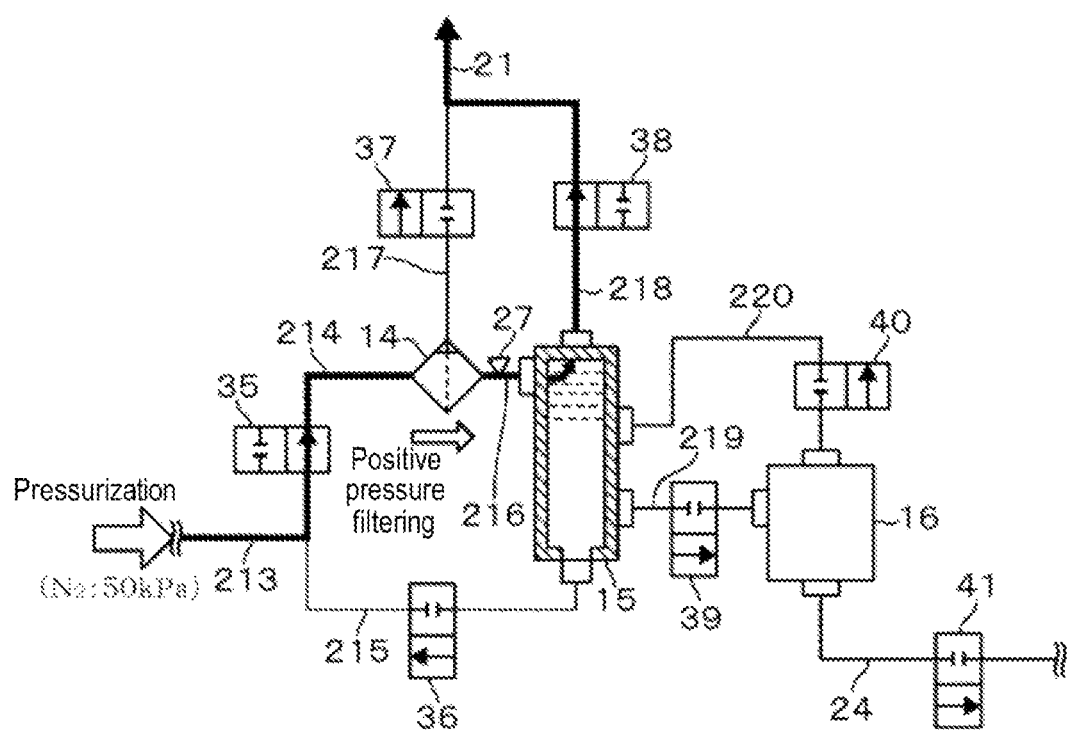
FIG. 4 is a fragmentary configuration diagram showing a resist flow in the vicinity of the filter unit during pressurization filtering.

A detailed procedure is as follows. The $N_2$ gas pressure is maintained, for example, at 50 kPa and the valve 37 is closed with the valve 35 and the valve 38 being opened. The resist is sent by pressure from the liquid end tank 13 into the trap via the filter unit 14, thereby performing filtering of the resist. The filtered resist is discharged, for example, from the drain pipe 21. In STEP A, a filtering amount of the resist in the filter unit 14 is, for example, 40 mL, and a filtering time is, for example, 30 seconds. The resist flow in STEP A is shown in FIG. 4.

<STEP B>

Next, filtering is performed by depressurizing the downstream side of the filter unit 14. In this example, the negative pressure filtering is performed on the filter unit 14.

As a detailed procedure of STEP B, STEP B includes the following two steps: a step using a suction action done by the pump unit 16 (STEP B-1); and a step using a compression action done by the pump unit 16 (STEP B-2). Said two steps will be described one after the other.

Figure 5:
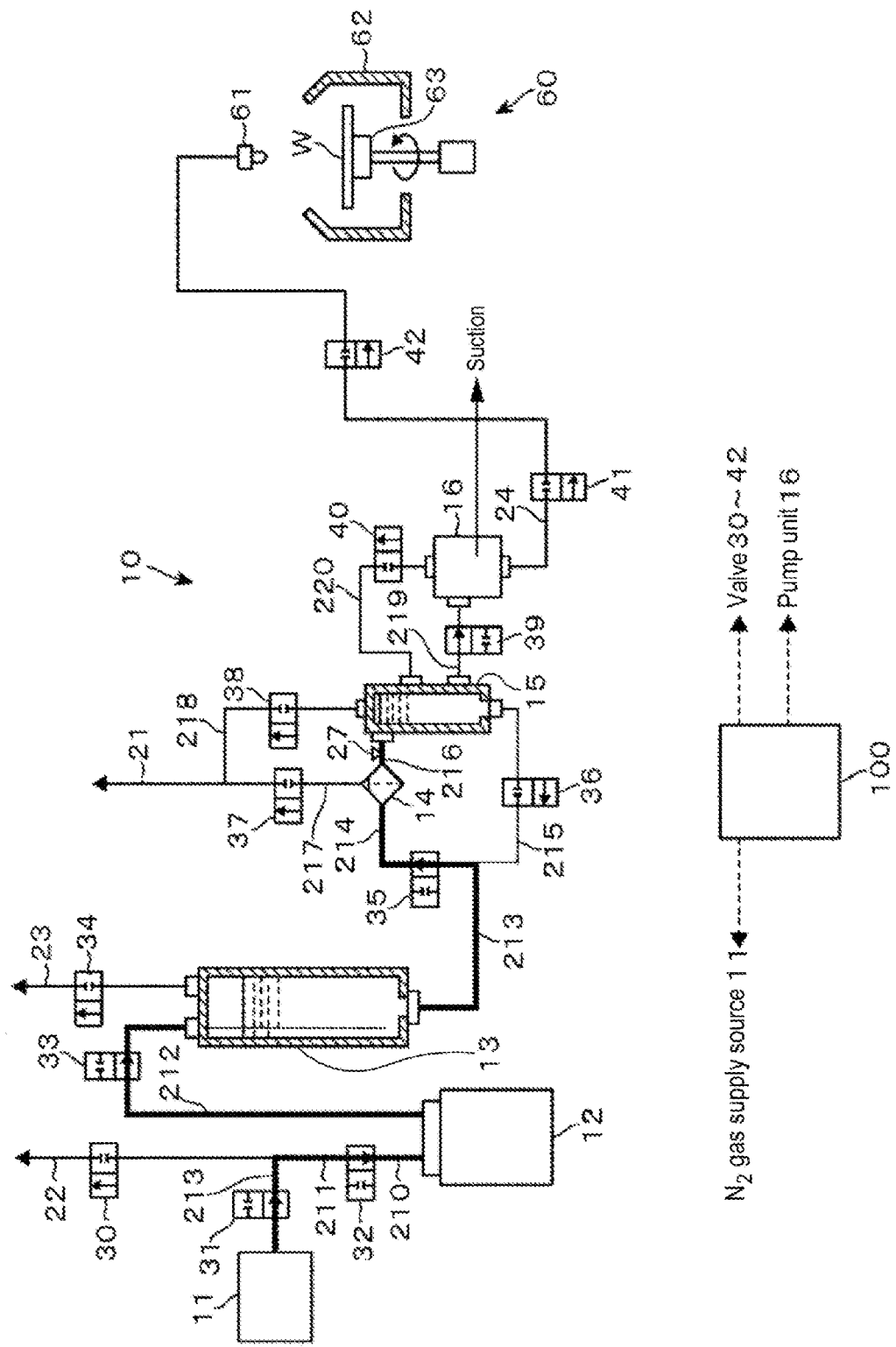
FIG. 5 is a configuration diagram showing a resist flow in the vicinity of the filter unit in during depressurization filtering.

First, STEP B-1 will be described. As shown in FIG. 5, the valves 37 and 38 are closed and the valve 39 is opened. Subsequently, the resist permeates into the interior of the filter unit 14 by suction to the interior of the pump unit 16. Then, the negative pressure filtering occurs in the filter unit 14 and thus fine bubble nucleuses, which remain in the filter unit 14, grow or expand. The expansion of bubble nucleuses caused by the negative pressure filtering will be described below as a part of a fine bubble removal mechanism. A portion of the bubbles having grown or expanded flows out to the downstream side of the filter unit 14. In STEP B-1, a filtering amount of the resist in the filter unit 14 is, for example, 60 mL, and a filtering rate of the resist in the filter unit 14 is, for example, 0.5 mL/sec.

Figure 6:
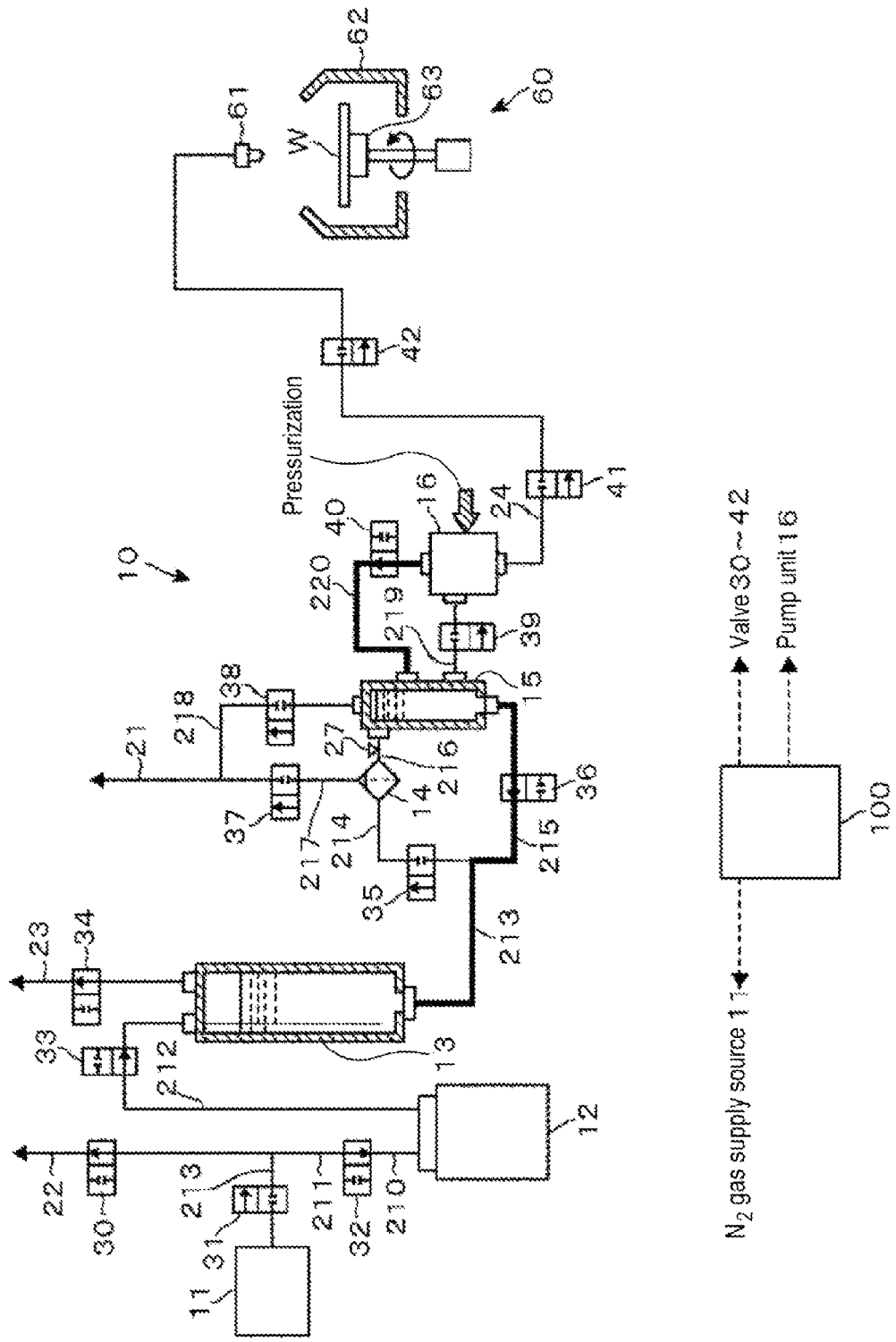
FIG. 6 is a configuration diagram showing a resist flow in the vicinity of the filter unit during pressurization filtering.

Next, STEP B-2 will be described. As shown in FIG. 6, the valve 31 is closed and the supply of the $N_2$ gas to the system is ceased. Subsequently, the valves 30, 33, 34, 36 and 40 are opened and the valve 35 is closed and the interior of the pump unit 16 is pressurized. Thus, the resist is pressurized and is reversely sent to the upstream side along a path of the valve 40, the trap 15, the valve 36 and the liquid end tank 13. Accordingly, the bubbles, which have flown out due to the above-described suction action done by the pump, are moved in between the liquid end tank 13 and the trap 15. In STEP B-2, the amount of the resist sent by pressure from the pump unit 16 is, for example, 0.5 mL.

<STEP C>

Next, a step for discharging the bubbles flown out through STEP B out of the system is performed.

A detailed procedure of STEP C is described. Initially, the valve 30 is closed again and the valves 31 and 32 are opened. Then, the $N_2$ gas pressure in the system is set to, for example, 50 kPa. Thereafter, the valves 35 and 37 are opened and the valves 36, 38 and 40 are closed, and the resist is sent by pressure from the liquid end tank 13 to the filter unit 14. Then, the resist containing the bubbles is discharged from the interior of the filter unit 14 via the drain pipe 21. The reason of that the resist does not pass through the trap 15 during the discharge of the resist is to prevent the bubbles from being attached to a secondary side of the filter unit 14 again by making the bubble-containing resist pass through the trap 15.

Further, the above-described STEP A, STEP B and STEP C make one cycle in that order and the cycle is repeated, for example, ten times. In this regard, if the bubbles do not flow out from the filter unit 14 at STEP B, then STEP C does not need to be performed and the repetition of STEP A and STEP B (this will be described below) may be performed instead.

In the repetition of the cycle, the negative pressure filtering is performed through STEP B and the bubbles expand. Thereafter, the positive pressure filtering is performed through STEP A. By doing so, the bubbles are subjected to an action referred to as "a collapse." Such an action causes the bubbles to go through a change such as making the bubble into a set of extremely fine bubbles, dissolving the bubbles to the resist, etc. The aforementioned changes facilitate the flow-out of the bubbles from the interior of the filter unit 14 at STEP A and STEP C. Those changes made to the bubbles will be described below as a part of a fine bubble removal mechanism.

After the process of repeating the cycle ten times is finished, STEP A and STEP B are repeated twenty times in the order of STEP A and STEP B. The repetition of STEP A and STEP B removes the bubbles in the entire fine portions of the filter unit 14. Therefore, the resist is widely spread to the fine portions of the filter unit 14.

Instead of one cycle consisted of STEP A, STEP B and STEP C, one cycle consisted of STEP B, STEP A and STEP C may be repeated, for example, ten times. Further, instead of repeating STEP A and STEP B twenty times as described above, STEP B and STEP A may be repeated twenty times in the order of STEP B and STEP A.

When the filter wetting process is finished as described above, processes relating to the process liquid supply apparatus are performed. By way of example, the resist is ejected onto the wafer W at a flow rate of, for example, 0.1 mL by the pressurization of the pump and the resist is coated by a spin coating method.

Detailed descriptions will be made as to the aforesaid mechanism for removing fine bubbles from the filter unit 14. The above-described embodiment repetitively performs the depressurization filtering (i.e., the negative pressure filtering) and the pressurization filtering (i.e., the positive pressure filtering). In this regard, the below-described mechanism removes the bubbles from fine structural portions of the filter unit 14. A large amount of fine bubbles exist in the filter of the filter unit 14 immersed in the resist. According to a theory of "Harvey's nucleus model," such fine bubbles are referred to as a bubble nucleus. This theory discloses the behavior of the bubble nucleus as described below.

Figure 7A:
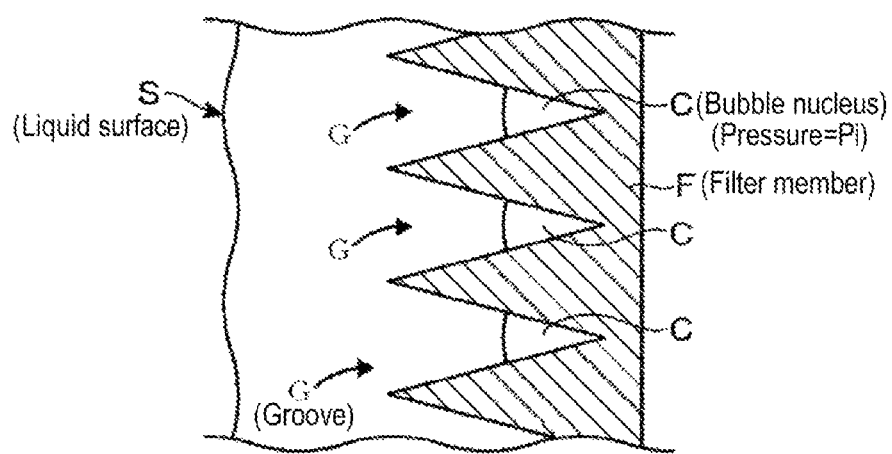
FIGS. 7A to 7D schematically show an extraction mechanism of bubble nucleuses in a supersaturated state.
Figure 7B:
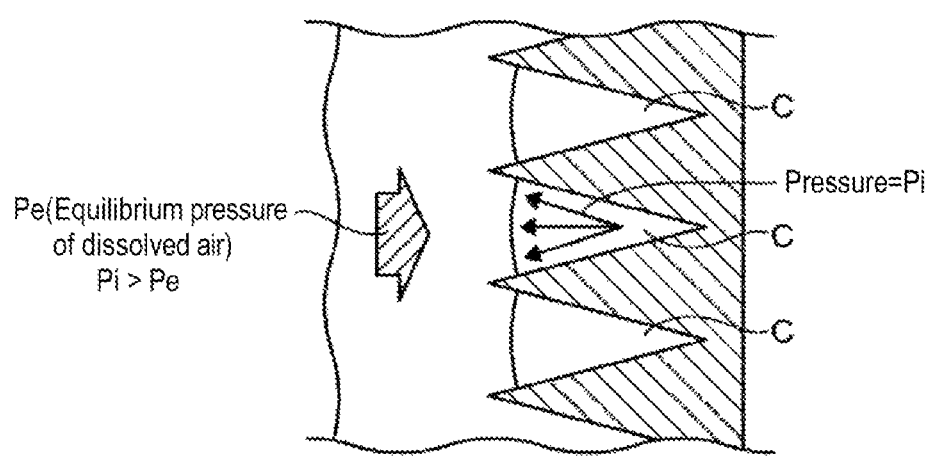
Figure 7C:
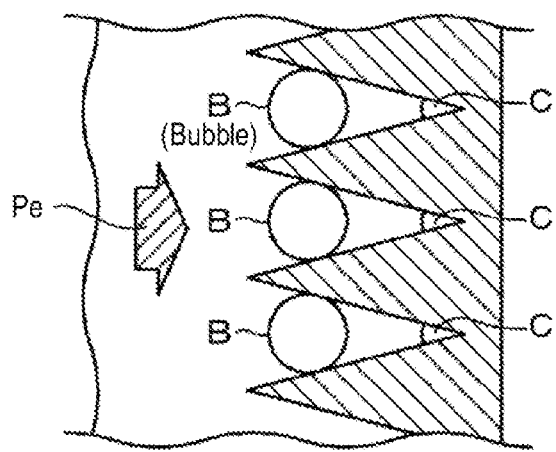
Figure 7D:
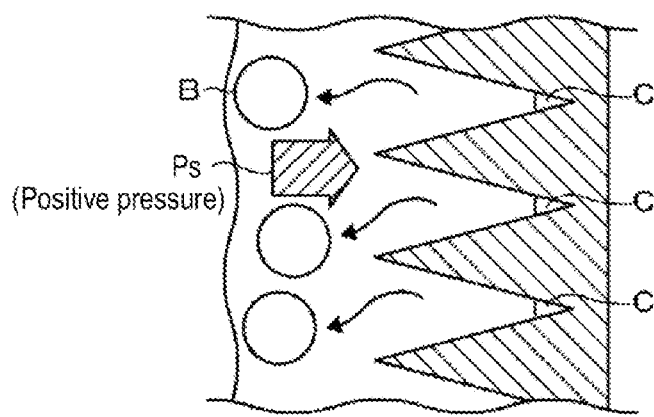

As shown in FIG. 7A, an air having a micro volume (a bubble nucleus C) is located in the innermost portion of a conical solid groove G and the groove is filled with liquid on the bubble nucleus. It is assumed that an air pressure of the bubble nucleus C is Pi and an equilibrium pressure of air dissolved in the liquid is Pe. When Pi is greater than Pe (Pi>Pe), the surface of the bubble nucleus C is pushed toward a liquid surface S (see FIG. 7B). When the surface of the bubble nucleus C is pushed up to a predetermined position, most of the bubble nucleuses are discharged into the liquid in the form of bubbles B (see FIG. 7C). Those bubbles B can be discharged from the filter unit 14 or the trap 15 via the drain pipe 21 (see FIG. 7D). After the bubbles B are discharged, the bubble nucleus C may remain in the groove G, while the volume of the remaining bubble nucleus C becomes smaller than the volume of the bubble nucleus C before the bubbles B are discharged.

Figure 8A:
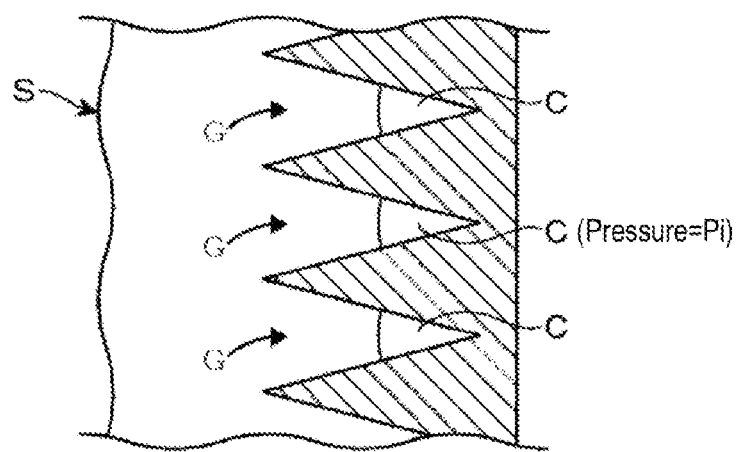
FIG. 8A to 8C schematically show a collapse mechanism of bubble nucleuses.
Figure 8B:
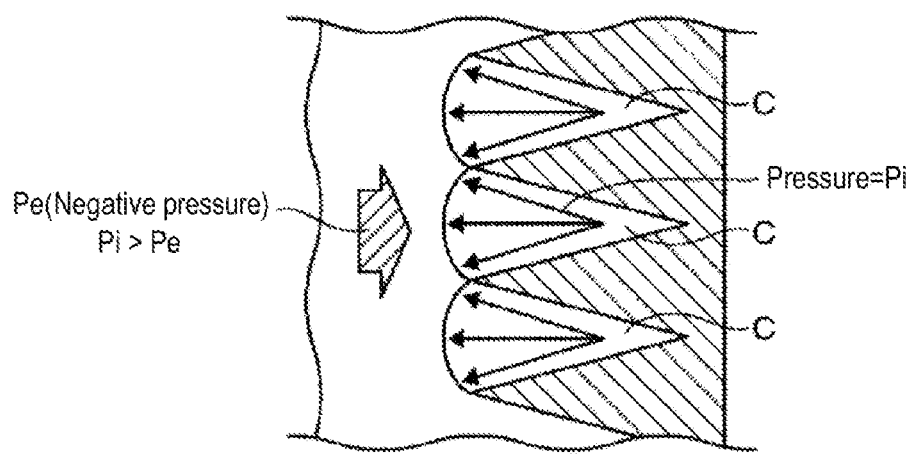
Figure 8C:
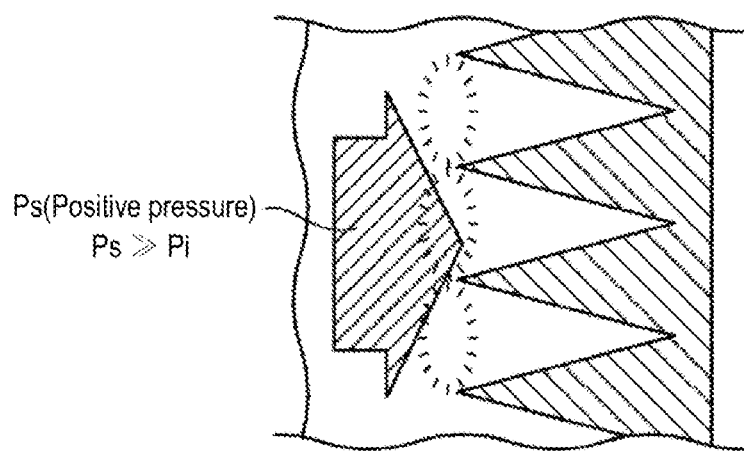

Further, a phenomenon referred to as "a collapse" is known with regard to the bubbles. The collapse means that a big bubble is destroyed and becomes fine bubbles. That is, when the negative pressure Pe is applied to the bubble nucleus C being in the innermost portion of the groove G as shown in FIG. 8A, the bubble nucleus C expands up to an end of the groove G since the air pressure Pi of the bubble nucleus C is greater than Pe (see FIG. 8B). If a positive pressure Ps greater than the air pressure Pi of the bubble nucleus C is rapidly applied to the expanding bubble nucleus C, then the bubble nucleus C is destroyed (see FIG. 8C). The destroyed bubble nucleus C becomes a large number of fine particles and spreads in a cloud shape and thus is removed from the filter unit 14. A series of those actions is the phenomenon referred to as "collapse."

Further, a phenomenon that bubbles become bigger due to the repetition of the positive pressure filtering and the negative pressure filtering may be explained as follows. That is, if liquid in which bubble nucleuses exist is supersaturated by decreasing a pressure of a dissolved gas or increasing a temperature of the liquid, then bubbles referred to as "a micro bubble" are created around the bubble nucleus. These micro bubbles have a characteristic of expanding through introducing the dissolved gas. Accordingly, the micro bubble may expand by decreasing the pressure of the liquid at a time when the micro bubbles are created. The micro bubbles that have expanded big (i.e., bubbles) can be easily removed.

Further, a phenomenon that the bubble nucleus is dissolved to the process liquid may be explained as follows. That is, when a vapor nucleus having a radius R is formed in liquid, the following equation may be established under a constant temperature and a constant pressure:

$$\frac{\Delta G}{4\pi\sigma R_*^2} = \left(\frac{R}{R_*}\right)^2 - \frac{2}{3}\left(\frac{R}{R_*}\right)^3 \quad (1)$$

Figure 9:
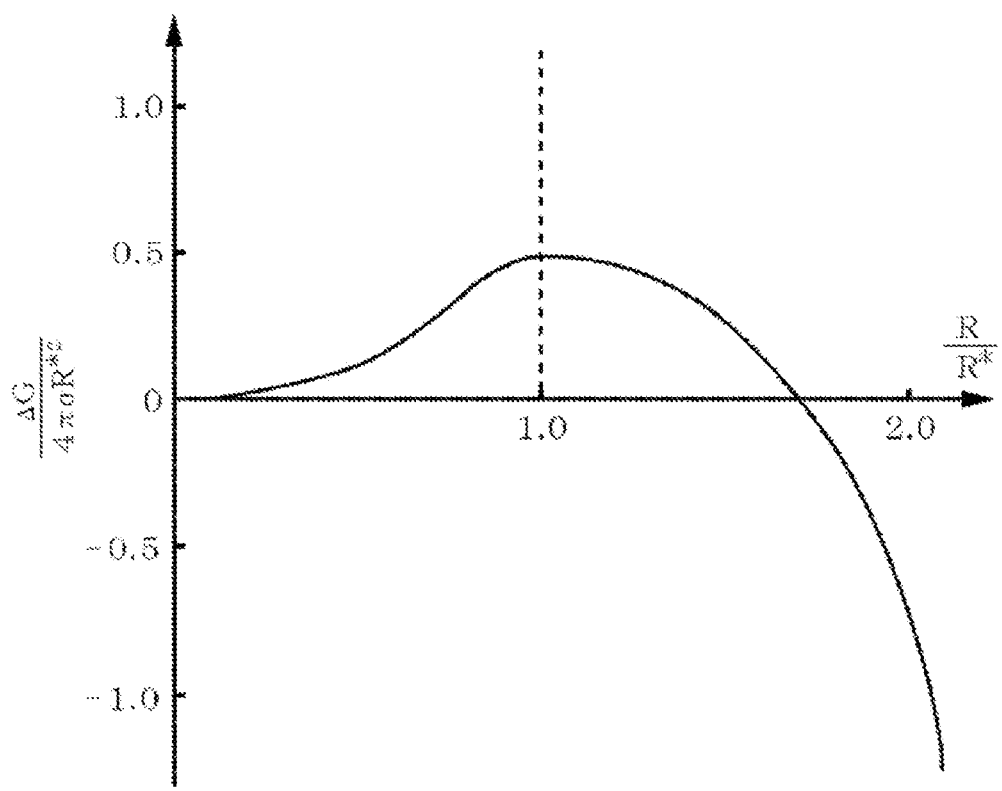
FIG. 9 is a graph showing a relationship between a potential of a bubble nucleus and a radius of a bubble nucleus.

In equation 1, G is a Gibbs' free energy and R* is a radius of the vapor nucleus uniquely determined depending upon temperature and pressure. The size of the vapor nucleus having the radius R* is referred to as "a basic size." Further, the left-hand side of the equation 1 is proportional to a potential of the vapor nucleus. FIG. 9 shows a graph in which a vertical axis is scaled by the left-hand side of the equation 1 and a horizontal axis is scaled by R/R*.

The vapor nucleus changes into a low-potential state in order to maintain an equilibrium state wherein it coexists with liquid, thereby changing its radius R. In the graph shown in FIG. 9, the potential of the vapor nucleus is highest when the radius R of the vapor nucleus is the basic size (i.e., R/R*=1). When the size of the vapor nucleus is smaller than the basic size (i.e., R/R*<1), the vapor nucleus changes into the low-potential state and thus R/R* changes to zero. Since R* is a constant number, R becomes zero and thus the vapor nucleus is annihilated. Further, when the size of the vapor nucleus is greater than the basic size (i.e., R/R*>1), the vapor nucleus also changes into the low-potential state, and thus R/R* increases. Since R* is a constant number, R increases and thus the vapor nucleus expands. When R/R*=1, the vapor nucleus goes into one of the above-described states, i.e., annihilation or expansion. Accordingly, the vapor nucleus is annihilated, expands or ruptures in the end.

Similar to the above-described actions, the bubbles in the filter unit 14 takes the behavior of expansion, rupture, annihilation, etc. through the repetition of the negative pressure filtering and the positive pressure filtering. The embodiments of the present disclosure remove the bubbles from the interior of the filter unit 14 using such actions.

Further, in the foregoing descriptions, after the process liquid is injected to the filter unit 14 and the trap 15, the entire system is maintained and the filter unit 14 is immersed in the process liquid before sending by pressure the process liquid to the filter unit 14. This step aims at making the process liquid to permeate into the fine portions of the filter unit 14 by virtue of a capillary phenomenon.

The permeation of the process liquid into the filter unit will be schematically explained. The relationship between time and the permeation of the process liquid to the fine portions caused by the capillary phenomenon may be represented as the following equation referred to as "a Washburn's equation."

$$z(t)^2 = \frac{1}{2}\frac{\gamma R \cos\theta_E}{\eta} t \quad (2)$$

Figure 10:
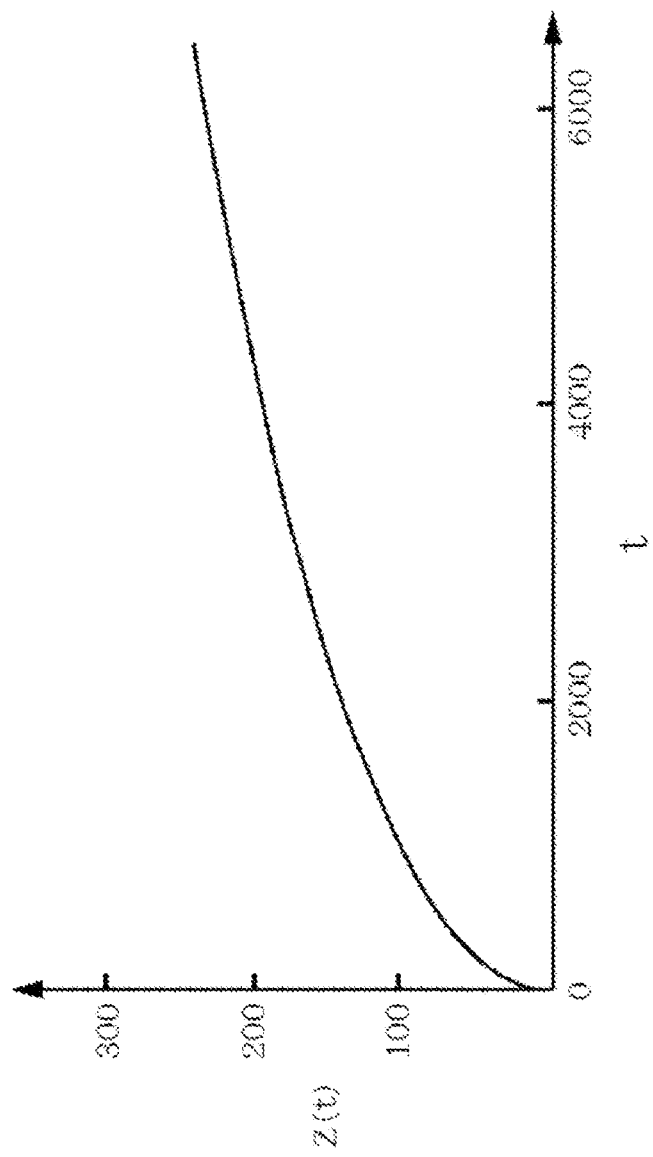
FIG. 10 is a graph showing a relationship between liquid permeability and time in a capillary phenomenon.

In equation 2, z is a permeation depth, $\theta_E$ is a static contact angle, $\gamma$ is a surface tension of the liquid, R is a radius of a capillary tube, $\eta$ is a coefficient of viscosity of the liquid, and t is time. In the equation 2, z is proportional to the square root of t. The graph shown in FIG. 10 shows the relationship between z and t. Referring to the graph shown in FIG. 10, as to the permeation of the process liquid into the filter, a natural permeation depth per a unit time is large at a stage as early as possible. That is, regarding the process of making the process liquid permeate into the fine portions by virtue of a capillary phenomenon, it is better in terms of time efficiency to perform said process at an initial stage of the filter wetting process.

The foregoing embodiments are described with an example wherein the resist supply apparatus 10 is used as the liquid processing apparatus according to the present disclosure. However, the process liquid handled by the liquid processing apparatus should not be limited to the resist. The liquid processing apparatus according to the present disclosure may be applied to the process of other liquid chemicals described in the background section, for example, the liquid chemical for forming an insulation film.

EXPERIMENTAL EXAMPLES

Descriptions will be made as to evaluation tests for evaluating the embodiments according to present disclosure and comparative tests for confirming the effects of the embodiments according to the present disclosure.

A. Evaluation Tests on Correlation between Number of Bubbles and Amount of Liquid-Permeation to Filter (Evaluation Test A-1)

The liquid processing apparatus having the same configuration as the foregoing embodiments was used. Liquid chemical was introduced to the liquid processing apparatus after a filter was mounted. Immediately thereafter, the positive pressure filtering and the negative pressure filtering were repeated with respect to the liquid chemical. The correlation between the liquid-permeation-to-filter amount and the number of bubbles having a size of 100 nm or more per 1 mL of the liquid chemical when performing the filter wetting process was examined (Evaluation Test A-2)

The same liquid processing apparatus as the evaluation test A-1 was used. Liquid chemical was introduced to the liquid processing apparatus after a filter was mounted. Then, the filter was immersed in the liquid chemical for 15 minutes. The positive pressure filtering and the negative pressure filtering were repeated with respect to the liquid chemical under the same conditions as the evaluation test A-1. The correlation between the liquid-permeation-to-filter amount and the number of bubbles having a size of 100 nm or more per 1 mL of the liquid chemical when performing the filter wetting process was examined (Comparative Test A-1)

The same liquid processing apparatus as the evaluation test A-1 was used. The correlation between the liquid-permeation-to-filter amount and the number of bubbles having a size of 100 nm or more per 1 mL of the liquid chemical when performing the filter wetting process only using the positive pressure filtering with respect to the liquid chemical was examined.

(Comparative Test A-2)

The same liquid processing apparatus as the evaluation test A-1 was used. The correlation between the liquid-permeation-to-filter amount and the number of bubbles having a size of 100 nm or more per 1 mL of the liquid chemical when performing the filter wetting process only using the negative pressure filtering with respect to the liquid chemical was examined Further, the conditions of the respective tests such as a $N_2$ gas pressure, a filtering rate, etc. are as follows.

Used liquid chemical: OK73 thinner (manufactured by Tokyo Ohka Kogyo Co., Ltd.)
$N_2$ gas pressure (in the positive pressure filtering): 50 kPa
Filtering rate (in the negative pressure filtering): 0.5 mL/sec
Liquid-permeation-to-filter amount per one time in the positive pressure filtering in the evaluation tests A-1 and A-2: 40 mL
Liquid-permeation-to-filter amount per one time in the negative pressure filtering in the evaluation tests A-1 and A-2: 60 mL.

Figure 11:
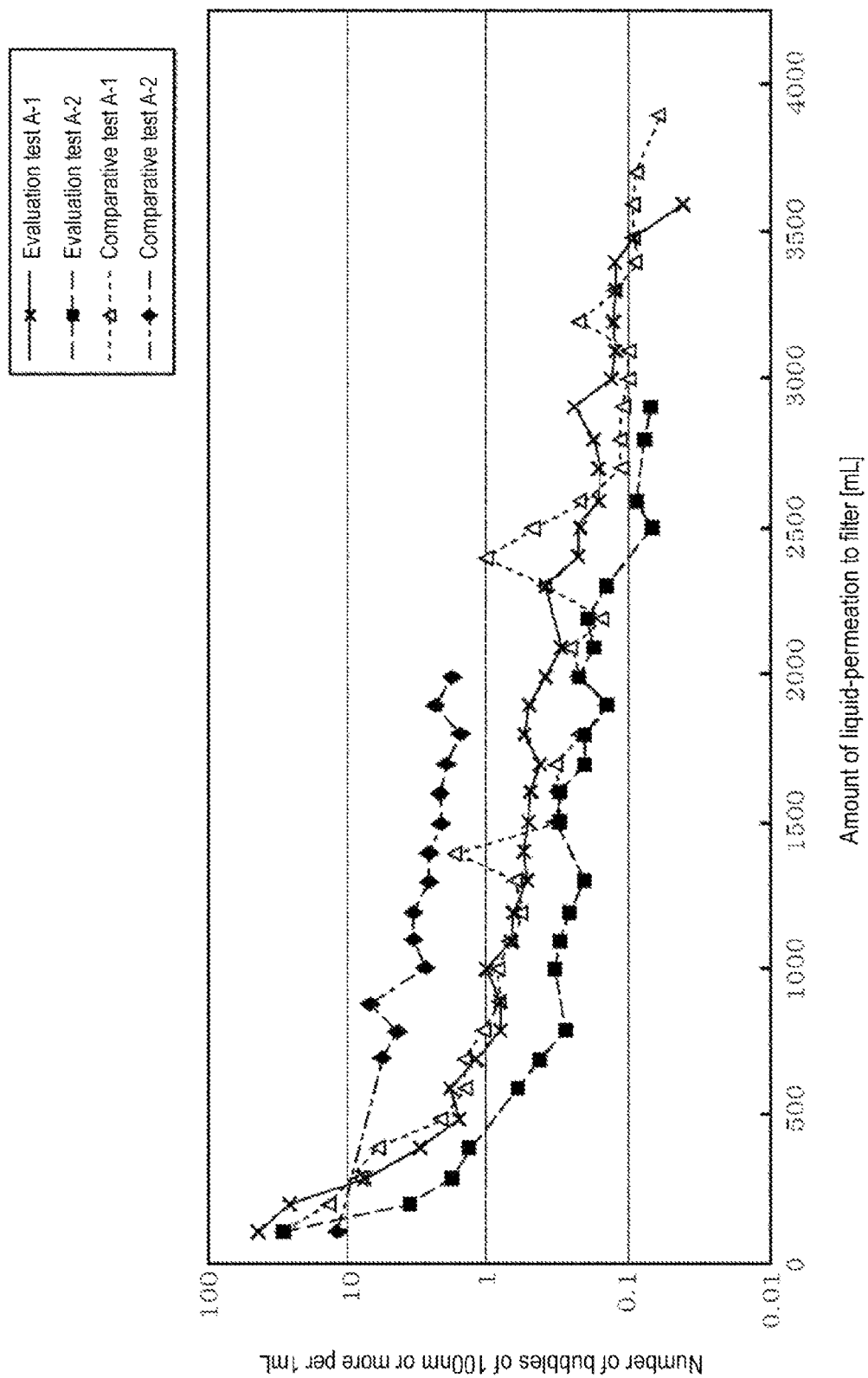
FIG. 11 is a graph showing results of comparative experiments for verifying the effects of the embodiments according to the present disclosure.

Examined results are shown in FIG. 11. In the graph shown in FIG. 11, a solid line indicates the results of the evaluation test A-1, a dashed line indicates the results of the evaluation test A-2, a dotted line indicates the results of the comparative test A-1, and a dot-and-dash line indicates the results of the comparative test A-2. A horizontal axis is scaled by the liquid-permeation-to-filter amount, while a vertical axis is scaled by the number of bubbles having a size of 100 nm or more per 1 mL on a logarithm basis.

According to the results shown in the graph, it is apparent from the results of the comparative test A-2 that the bubbles are not sufficiently removed from the filter only by the negative pressure filtering. Further, when assuming the state where the number of bubbles of per 1 mL is 0.1 as a stable state with respect to other experimental examples, the evaluation test A-1 and the comparative test A-1 needed the liquid-permeation-to-filter amount of about 3500 mL until the number of bubbles reaches the stable state. However, when comparing these two tests, the comparative test A-1 showed that the number of bubbles occasionally increases sharply during the liquid permeation, whereas the evaluation test A-1 hardly showed the increase in the number of bubbles during the liquid permeation. Accordingly, the results of the evaluation test A-1 is superior to the results of the comparative test A-1.

Further, the evaluation test A-2 needed the liquid-permeation-to-filter amount of about 2500 mL until the number of bubbles reaches the stable state. The evaluation test A2 showed an obvious decrease in the liquid-permeation-to-filter amount when compared to other three tests. Further, a significant increase in the number of bubbles was not observed during the liquid permeation in the evaluation test A-2.

The aforementioned four test results show that the process in the evaluation test A-2 (i.e., the process wherein the filter unit is immersed and then maintained in the liquid chemical after the filter is replaced, and thereafter the positive pressure filtering and the negative pressure filtering is alternately repeated) leads to the reduction in a consumption amount of the liquid chemical in the filter wetting process.

B. evaluation test on correlation between number of bubbles and continuous negative pressure filtering after the filter wetting process (Evaluation Test B-1)

The same liquid processing apparatus as the evaluation test A-1 was used and the same procedure as the evaluation test A-1 was carried out. After the number of bubbles per 1 mL of the liquid chemical reached 0.1, a test of repeating the negative pressure filtering for 6 seconds at the filtering rate of 0.5 mL/sec 100 times was carried out 4 times. Then, a distribution of the number of bubbles having a size of 100 nm or more per 1 mL of the liquid chemical was examined (Evaluation Test B-2)

The same liquid processing apparatus as the evaluation test A-2 was used and the same procedure as the evaluation test A-2 was carried out. After the number of bubbles per 1 mL of the liquid chemical reached 0.1, a test of repeating the negative pressure filtering for 6 seconds at the filtering rate of 0.5 mL/sec 100 times was carried out 4 times. Then, a distribution of the number of bubbles having a size of 100nm or more per 1 mL of the liquid chemical was examined (Comparative Test B-1)

Figure 12:
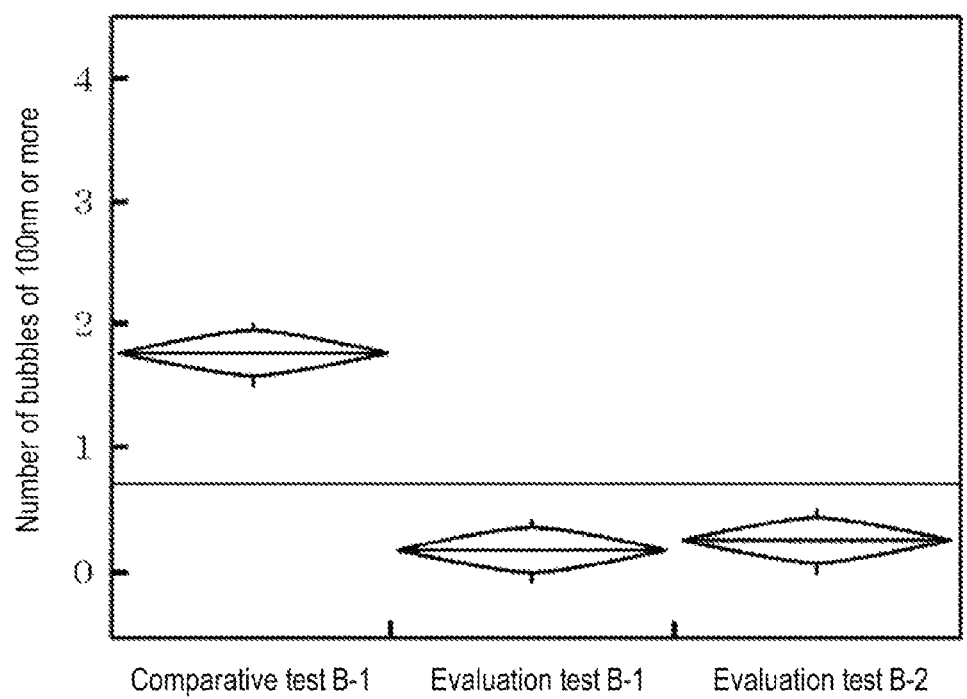
FIG. 12 is a graph showing results of comparative experiments for verifying the effects of the embodiments according to the present disclosure.

The same liquid processing apparatus as the comparative test A-1 was used and the same procedure as the comparative A-1 was carried out. After the number of bubbles per 1 mL of the liquid chemical reached 0.1, a test of repeating the negative pressure filtering for 6 seconds at the filtering rate of 0.5 mL/sec 100 times was carried out 4 times. Then, a distribution of the number of bubbles having a size of 100 nm or more per 1mL of the liquid chemical was examined Examined results are shown in FIG. 12. The comparative test B-1 shows that the number of bubbles has a main distribution in the vicinity of about 2 per 1 mL of the liquid chemical. However, the evaluation tests B-1 and B-2 show that the number of bubbles has a distribution in the vicinity of about 0.5 and further show a decrease in the number of bubbles when compared to the comparative test B-1. Further, the statistical examination on the observed number of bubbles give meaningful differences between the evaluation tests and the comparative tests ($p<0.05$).

The above-explained evaluation tests reveals that the repetition of only the negative pressure filtering after the filter wetting process does not increase the number of bubbles in the liquid chemical with regard to the method of repeating the positive pressure filtering and the negative pressure filtering on the filter in the filter wetting process associated with the replacement of the filter. Accordingly, it is verified that the embodiments of the present disclosure provides an improved effects when compared to the conventional filter wetting process using only the positive pressure filtering.

The embodiments of the present disclosure repeats a depressurization step depressurizing the downstream side of the filter unit and a pressurization step pressurizing the upstream side of the filter unit several times, when the filter unit is newly mounted in a passage member of the process liquid apparatus or the filter unit mounted in the passage member of the process liquid apparatus is replaced with new one. Through such repetition, the bubbles in the filter unit expand or are annihilated. Thus, the bubbles in the filter unit can be rapidly removed by the expansion action or the annihilation action. Accordingly, the operative time, which is spent from immersing the filter in the process liquid until providing the filter for actual operation regarding replacing the filter, can be shortened and the consumption of the process liquid can be reduced.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A process liquid supply apparatus, comprising:
    a process liquid supply source;
    a filter unit that filters a process liquid supplied from the process liquid supply source, the filter unit being connected to the process liquid supply source via a first pipe and a first valve provided in the first pipe;
    a trap that stores the process liquid ejected from the filter unit, the trap being connected to the filter unit via a second pipe;
    a discharge outlet that discharges a gas in the process liquid from the filter unit and the trap, the discharge outlet being connected to the filter unit via a third pipe and a second valve provided in the third pipe and to the trap via a fourth pipe and a third valve provided in the fourth pipe;
    a liquid sending unit that supplies the process liquid from the trap to target objects through a nozzle, the liquid sending unit being connected to the trap via a fifth pipe and a fourth valve provided in the fifth pipe;
    a pressurizing gas supply source that supplies a pressurizing gas to pressurize an upstream side of the filter unit; and
    a controller configured to control operations of the process liquid supply source, the filter unit, the trap, the discharge outlet, the liquid sending unit and the pressurizing gas supply source,
    wherein the controller is configured to open the first and second valves and closes the third and fourth valves while controlling the pressurizing gas supply source to pressurize the upstream side of the filter unit, so that the filter unit is filled with the process liquid from the upstream side of the filter unit to a downstream side of the filter unit, and
    wherein the controller is configured to perform a control to repeat a depressurization filtering process and a pressurization filtering process for a predetermined number of times by:
        in the depressurization filtering process, opening the first and fourth valve and closing the second and third valves while controlling the liquid sending unit to perform a suction action, so that the process liquid is depressurized in the downstream side of the filter unit and permeates through the filter unit; and
        in the pressurization filtering process, opening the first and third valves and closing the second and fourth valves while controlling the pressurizing gas supply source to pressurize the upstream side of the filter unit, so that the process liquid is pressurized from the upstream side of the filter unit and permeates through the filter unit.

2. The apparatus of claim 1, wherein the controller performs the pressurization filtering process before performing repeating the depressurization filtering process and the pressurization filtering process.

3. The apparatus of claim 1, further comprising:
    a bypass passage having an upstream end connected to an upstream side of the first valve and a downstream end connected to the trap, a fifth valve being provided in the bypass passage,
    wherein in the depressurization filtering process, the controller opens the fourth and fifth valves and closes the first to third valves while controlling the pressurizing gas supply source to stop supply of the pressurizing gas and controlling the liquid sending unit to perform a compression action, so that the process liquid is depressurized in the downstream side of the filter unit and the process liquid is reversely sent through the bypass passage by the liquid sending unit.

4. The apparatus of claim 1, wherein in the pressurization filtering process, the controller opens the discharge outlet, and
    wherein the process liquid is discharged from the filer unit and the trap by pressure through the discharge outlet.

5. The apparatus of claim 1, further comprising:
    a liquid particle counter provided in the second pipe,
    wherein the controller controls the liquid particle counter to monitor bubbles in the process liquid while the process liquid is discharged from the filter unit and the trap through the discharge outlet.

* * * * *